United States Patent
Seo

(10) Patent No.: US 11,997,860 B2
(45) Date of Patent: May 28, 2024

(54) LIGHT-EMITTING ELEMENT

(71) Applicant: Semiconductor Energy Laboratory Co., Ltd., Atsugi (JP)

(72) Inventor: Satoshi Seo, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/978,252

(22) Filed: Nov. 1, 2022

(65) Prior Publication Data

US 2023/0097122 A1 Mar. 30, 2023

Related U.S. Application Data

(63) Continuation of application No. 16/879,819, filed on May 21, 2020, now Pat. No. 11,495,763, which is a (Continued)

(30) Foreign Application Priority Data

Feb. 9, 2012 (JP) .................................. 2012-025834

(51) Int. Cl.
*H10K 50/11* (2023.01)
*C09K 11/02* (2006.01)
(Continued)

(52) U.S. Cl.
CPC .............. *H10K 50/11* (2023.02); *C09K 11/02* (2013.01); *C09K 11/06* (2013.01); *H10K 50/00* (2023.02);
(Continued)

(58) Field of Classification Search
None
See application file for complete search history.

(56) References Cited

U.S. PATENT DOCUMENTS 6,911,271 B1 6/2005 Lamansky et al.
6,939,624 B2 9/2005 Lamansky et al.
(Continued)

FOREIGN PATENT DOCUMENTS

CN 101321755 A 12/2008
CN 101728415 A 6/2010
(Continued)

OTHER PUBLICATIONS

Bizzarri, C., et al. "Triplet emitters versus TADF emitters in OLEDs: A comparative study." Polyhedron 140 (2018): 51-66. (Year: 2018).*

(Continued)

*Primary Examiner* — Robert S Loewe
(74) *Attorney, Agent, or Firm* — Fish & Richardson P.C.

(57) ABSTRACT

Provided is a light-emitting element with high external quantum efficiency and a low drive voltage. The light-emitting element includes a light-emitting layer which contains a phosphorescent compound and a material exhibiting thermally activated delayed fluorescence between a pair of electrodes, wherein a peak of a fluorescence spectrum and/or a peak of a phosphorescence spectrum of the material exhibiting thermally activated delayed fluorescence overlap(s) with a lowest-energy-side absorption band in an absorption spectrum of the phosphorescent compound, and wherein the phosphorescent compound exhibits phosphorescence in the light-emitting layer by voltage application between the pair of electrodes.

13 Claims, 2 Drawing Sheets

Related U.S. Application Data continuation of application No. 16/188,493, filed on Nov. 13, 2018, now Pat. No. 10,693,093, which is a continuation of application No. 15/584,830, filed on May 2, 2017, now Pat. No. 10,326,093, which is a continuation of application No. 15/293,744, filed on Oct. 14, 2016, now Pat. No. 9,673,404, which is a continuation of application No. 14/657,384, filed on Mar. 13, 2015, now Pat. No. 9,478,764, which is a continuation of application No. 13/760,301, filed on Feb. 6, 2013, now Pat. No. 8,981,355.

(51) Int. Cl.

| | |
|---|---|
| *C09K 11/06* | (2006.01) |
| *H10K 50/00* | (2023.01) |
| *H10K 50/12* | (2023.01) |
| *H10K 50/15* | (2023.01) |
| *H10K 50/16* | (2023.01) |
| *H10K 50/17* | (2023.01) |
| *H10K 85/30* | (2023.01) |
| *H10K 85/60* | (2023.01) |
| H01L 31/0232 | (2014.01) |
| H10K 101/00 | (2023.01) |
| H10K 101/10 | (2023.01) |
| H10K 101/30 | (2023.01) |
| H10K 101/40 | (2023.01) |
| H10K 102/00 | (2023.01) |

(52) U.S. Cl.
CPC ........... *H10K 50/121* (2023.02); *H10K 50/15* (2023.02); *H10K 50/16* (2023.02); *H10K 50/171* (2023.02); *H10K 85/30* (2023.02); *H10K 85/346* (2023.02); *H10K 85/654* (2023.02); *H10K 85/6572* (2023.02); *C09K 2211/1007* (2013.01); *C09K 2211/1029* (2013.01); *C09K 2211/1059* (2013.01); *C09K 2211/185* (2013.01); *C09K 2211/188* (2013.01); *H01L 31/02322* (2013.01); *H10K 50/17* (2023.02); *H10K 85/649* (2023.02); *H10K 2101/10* (2023.02); *H10K 2101/27* (2023.02); *H10K 2101/30* (2023.02); *H10K 2101/40* (2023.02); *H10K 2102/00* (2023.02)

(56) References Cited

U.S. PATENT DOCUMENTS

| | | | |
|---|---|---|---|
| 7,175,922 B2 | 2/2007 | Jarikov et al. |
| 7,183,010 B2 | 2/2007 | Jarikov |
| 7,332,857 B2 | 2/2008 | Seo et al. |
| 7,381,479 B2 | 6/2008 | Lamansky et al. |
| 7,553,560 B2 | 6/2009 | Lamansky et al. |
| 7,572,522 B2 | 8/2009 | Seo et al. |
| 7,597,967 B2 | 10/2009 | Kondakova et al. |
| 7,683,363 B2 | 3/2010 | Miteva et al. |
| 7,735,421 B2 | 6/2010 | Vosseler |
| 7,771,844 B2 | 8/2010 | Inoue et al. |
| 7,875,366 B2 | 1/2011 | Tsuboyama et al. |
| 7,943,925 B2 | 5/2011 | Yamazaki |
| 7,960,038 B2 | 6/2011 | Ohsawa et al. |
| 7,993,760 B2 | 8/2011 | Komori et al. |
| 8,021,574 B2 | 9/2011 | Kawamura et al. |
| 8,025,815 B2 | 9/2011 | Kawamura et al. |
| 8,026,663 B2 | 9/2011 | Matsumoto et al. |
| 8,029,697 B2 | 10/2011 | Kawamura et al. |
| 8,034,256 B2 | 10/2011 | Kawamura et al. |
| 8,034,465 B2 | 10/2011 | Liao et al. |
| 8,084,145 B2 | 12/2011 | Inoue et al. |
| 8,154,195 B2 | 4/2012 | Nishimura et al. |
| 8,211,552 B2 | 7/2012 | Nishimura et al. |
| 8,221,907 B2 | 7/2012 | Kawamura et al. |
| 8,274,214 B2 | 9/2012 | Ikeda et al. |
| 8,294,142 B2 | 10/2012 | Nishimura et al. |
| 8,330,350 B2 | 12/2012 | Nishimura et al. |
| 8,436,343 B2 | 5/2013 | Nishimura et al. |
| 8,445,899 B2 | 5/2013 | Murayama et al. |
| 8,568,903 B2 | 10/2013 | Kawamura et al. |
| 8,587,192 B2 | 11/2013 | Nishimura et al. |
| 8,653,537 B2 | 2/2014 | He et al. |
| 8,779,655 B2 | 7/2014 | Nishimura et al. |
| 8,853,680 B2 | 10/2014 | Yamazaki et al. |
| 8,877,351 B2 | 11/2014 | Inoue et al. |
| 8,963,127 B2 | 2/2015 | Pieh et al. |
| 8,981,355 B2 | 3/2015 | Seo |
| 8,993,129 B2 | 3/2015 | Endo et al. |
| 8,994,263 B2 | 3/2015 | Shitagaki et al. |
| 9,040,962 B2 | 5/2015 | Adamovich et al. |
| 9,054,317 B2 | 6/2015 | Monkman et al. |
| 9,079,879 B2 | 7/2015 | Kadoma et al. |
| 9,082,995 B2 | 7/2015 | Nishimura et al. |
| 9,159,942 B2 | 10/2015 | Seo et al. |
| 9,175,213 B2 | 11/2015 | Seo et al. |
| 9,276,228 B2 | 3/2016 | Seo et al. |
| 9,299,944 B2 | 3/2016 | Seo et al. |
| 9,356,250 B2 | 5/2016 | Ohsawa et al. |
| 9,478,764 B2 | 10/2016 | Seo |
| 9,559,313 B2 | 1/2017 | Seo et al. |
| 9,604,928 B2 | 3/2017 | Shitagaki et al. |
| 9,673,404 B2 | 6/2017 | Seo |
| 9,899,608 B2 | 2/2018 | Kadoma et al. |
| 9,947,885 B2 | 4/2018 | Seo et al. |
| 2003/0175553 A1 | 9/2003 | Thompson et al. |
| 2003/0205696 A1 | 11/2003 | Thoms et al. |
| 2005/0048310 A1 | 3/2005 | Cocchi et al. |
| 2005/0056815 A1 | 3/2005 | Miteva et al. |
| 2005/0221116 A1 | 10/2005 | Cocchi et al. |
| 2005/0231103 A1 | 10/2005 | Kim et al. |
| 2006/0134464 A1 | 6/2006 | Nariyuki |
| 2006/0279203 A1 | 12/2006 | Forrest et al. |
| 2007/0072001 A1 | 3/2007 | Tsuboyama et al. |
| 2007/0090756 A1 | 4/2007 | Okada et al. |
| 2007/0181025 A1 | 8/2007 | Vosseler |
| 2008/0203406 A1 | 8/2008 | He et al. |
| 2008/0238302 A1 | 10/2008 | Sung et al. |
| 2008/0286607 A1 | 11/2008 | Nomura et al. |
| 2009/0045731 A1 | 2/2009 | Nishimura et al. |
| 2009/0302742 A1 | 12/2009 | Komori et al. |
| 2010/0090209 A1 | 4/2010 | Ikari et al. |
| 2010/0090593 A1 | 4/2010 | Mori et al. |
| 2010/0139510 A1 | 6/2010 | Vosseler |
| 2010/0171109 A1 | 7/2010 | Nishimura et al. |
| 2010/0331585 A1 | 12/2010 | Kawamura et al. |
| 2011/0001146 A1 | 1/2011 | Yamazaki et al. |
| 2011/0121320 A1 | 5/2011 | Pieh et al. |
| 2011/0210316 A1 | 9/2011 | Kadoma et al. |
| 2011/0220882 A1 | 9/2011 | Inoue et al. |
| 2011/0298360 A1 | 12/2011 | Ohsawa et al. |
| 2012/0091445 A1 | 4/2012 | Jung et al. |
| 2012/0098417 A1 | 4/2012 | Inoue et al. |
| 2012/0205632 A1 | 8/2012 | Shitagaki et al. |
| 2012/0205687 A1 | 8/2012 | Yamazaki et al. |
| 2012/0206035 A1 | 8/2012 | Shitagaki et al. |
| 2012/0217487 A1 | 8/2012 | Yamazaki et al. |
| 2012/0217869 A1 | 8/2012 | Adachi et al. |
| 2012/0241732 A1 | 9/2012 | Endo et al. |
| 2012/0242219 A1 | 9/2012 | Seo et al. |
| 2012/0248424 A1 | 10/2012 | Sasaki |
| 2012/0256535 A1 | 10/2012 | Seo et al. |
| 2012/0305904 A1 | 12/2012 | Kai et al. |
| 2014/0084269 A1 | 3/2014 | Weaver et al. |
| 2014/0138669 A1 | 5/2014 | Nakagawa et al. |
| 2015/0069352 A1 | 3/2015 | Kim et al. |
| 2015/0166886 A1 | 6/2015 | Endo et al. |
| 2016/0056393 A1 | 2/2016 | Oikawa et al. |
| 2018/0013073 A1 | 1/2018 | Duan et al. |

(56) References Cited

U.S. PATENT DOCUMENTS

| | | | |
|---|---|---|---|
| 2018/0130958 A1 | 5/2018 | Kadoma et al. | |
| 2018/0226600 A1 | 8/2018 | Seo et al. | |

FOREIGN PATENT DOCUMENTS

| | | |
|---|---|---|
| CN | 102648268 A | 8/2012 |
| EP | 1202608 A | 5/2002 |
| EP | 1484379 A | 12/2004 |
| EP | 1956022 A | 8/2008 |
| EP | 2166585 A | 3/2010 |
| EP | 2166586 A | 3/2010 |
| EP | 2166587 A | 3/2010 |
| EP | 2166588 A | 3/2010 |
| EP | 2166589 A | 3/2010 |
| EP | 2166590 A | 3/2010 |
| EP | 2166591 A | 3/2010 |
| EP | 2175491 A | 4/2010 |
| EP | 2363398 A | 9/2011 |
| EP | 2447335 A | 5/2012 |
| EP | 2482619 A | 8/2012 |
| EP | 2493269 A | 8/2012 |
| EP | 2511360 A | 10/2012 |
| EP | 2566302 A | 3/2013 |
| EP | 3038434 A | 6/2016 |
| EP | 3176241 A | 6/2017 |
| JP | 2002-093573 A | 3/2002 |
| JP | 2002-203683 A | 7/2002 |
| JP | 2003-317966 A | 11/2003 |
| JP | 2004-506305 | 2/2004 |
| JP | 2004-241374 A | 8/2004 |
| JP | 2005-190987 A | 7/2005 |
| JP | 2005-314414 A | 11/2005 |
| JP | 2006-024830 A | 1/2006 |
| JP | 2006-062365 A | 3/2006 |
| JP | 2006-182775 A | 7/2006 |
| JP | 2006-352102 A | 12/2006 |
| JP | 2008-509565 | 3/2008 |
| JP | 2008-247810 A | 10/2008 |
| JP | 2008-288344 A | 11/2008 |
| JP | 2010-030996 A | 2/2010 |
| JP | 2010-093181 A | 4/2010 |
| JP | 2010-114425 A | 5/2010 |
| JP | 2010-140980 A | 6/2010 |
| JP | 2010-222331 A | 10/2010 |
| JP | 4593631 | 12/2010 |
| JP | 2011-070963 A | 4/2011 |
| JP | 2011-199019 A | 10/2011 |
| JP | 2011-213643 A | 10/2011 |
| JP | 2012-044125 A | 3/2012 |
| JP | 5877805 | 3/2016 |
| JP | 6078181 | 2/2017 |
| JP | 2017-073571 A | 4/2017 |
| KR | 2003-0041972 A | 5/2003 |
| KR | 2003-0073171 A | 9/2003 |
| KR | 10-0689124 | 3/2007 |
| KR | 2007-0056061 A | 5/2007 |
| KR | 2008-0085001 A | 9/2008 |
| KR | 2008-0088031 A | 10/2008 |
| KR | 2010-0040679 A | 4/2010 |
| KR | 10-1027896 | 4/2011 |
| KR | 2011-0099173 A | 9/2011 |
| KR | 2012-0112517 A | 10/2012 |
| KR | 2013-0092447 A | 8/2013 |
| KR | 2013-0116185 A | 10/2013 |
| KR | 2014-0018133 A | 2/2014 |
| TW | I285441 | 8/2007 |
| TW | 200734340 | 9/2007 |
| TW | 201136931 | 11/2011 |
| WO | WO-2000/070655 | 11/2000 |
| WO | WO-2002/015645 | 2/2002 |
| WO | WO-2005/054404 | 6/2005 |
| WO | WO-2006/015567 | 2/2006 |
| WO | WO-2006/033857 | 3/2006 |
| WO | WO-2007/063754 | 6/2007 |
| WO | WO-2009/008346 | 1/2009 |
| WO | WO-2009/157498 | 12/2009 |
| WO | WO-2010/106853 | 9/2010 |
| WO | WO-2010/151084 | 12/2010 |
| WO | WO-2011/070963 | 6/2011 |
| WO | WO-2011/136755 | 11/2011 |
| WO | WO-2013/012297 | 1/2013 |

OTHER PUBLICATIONS

Hung, Wen-Yi, et al. "Phenylcarbazole-dipyridyl triazole hybrid as bipolar host material for phosphorescent OLEDs." Journal of Materials Chemistry 22.12 (2012): 5410-5418. (Year: 2012).*

Liao, Jia-Ling, et al. "Os (II) phosphors with near-infrared emission induced by ligand-to-ligand charge transfer transition." Inorganic Chemistry 53.17 (2014): 9366-9374. (Year: 2014).*

Baldo.M et al., "Very High-Efficiency Green Organic Light-Emitting Devices Based on Electrophosphorescence", Appl. Phys. Lett. (Applied Physics Letters), Jul. 5, 1999, vol. 75, No. 1, pp. 4-6.

Choong.V et al., "Organic Light-Emitting Diodes With a Bipolar Transport Layer", Appl. Phys. Lett. (Applied Physics Letters), Jul. 12, 1999, vol. 75, No. 2, pp. 172-174.

Itano.K et al., "Exciplex formation at the organic solid-state interface: Yellow emission in organic light-emitting diodes using green-fluorescent tris(8-quinolinolato)aluminum and hole-transporting molecular materials with low ionization potentials", Appl. Phys. Lett. (Applied Physics Letters), Feb. 9, 1998, vol. 72, No. 6, pp. 636-638.

Endo.A et al., "Efficient Up-Conversion of Triplet Excitons Into a Singlet State and Its Application for Organic Light Emitting Diodes", Appl. Phys. Lett. (Applied Physics Letters), Feb. 24, 2011, vol. 98, No. 8, pp. 083302-1-083302-3.

Hamamura.S et al., "Theoretical Study on Equilibrium Structure and Spectra Analysis of Iridium Complex by QM/MM Aimed at Development of Blue Light-emitting Material", The 4th Annual meeting of Society for Molecular Science, Sep. 16, 2010, No. 4, p. 3P117.

Hamamura.S et al., "Theoretical Study on Equilibrium Structure and Spectra of Ir(ppy)3 Added to CBP", The 3rd Annual meeting of Society for Molecular Science, Sep. 23, 2009, No. 3, p. 3P137.

Yersin.H et al., Highly Efficient OLEDs with Phosphorescent Materials, 2008, pp. 1-97,283-309, Wiley-VCH Verlag GmbH & Co.

Tokito.S et al., "Improvement in performance by doping", Organic EL Display, Aug. 20, 2004, pp. 67-99, Ohmsha.

Jeon.W et al., "Ideal host and guest system in phosphorescent OLEDs", Organic Electronics, 2009, vol. 10, pp. 240-246, Elsevier.

Su.S et al., "RGB Phosphorescent Organic Light-Emitting Diodes by Using Host Materials with Heterocyclic Cores:Effect of Nitrogen Atom Orientations", Chem. Mater. (Chemistry of Materials), 2011, vol. 23, No. 2, pp. 274-284.

Rausch.A et al., "Matrix Effects on the Triplet State of the OLED Emitter Ir(4,6-dFppy)2(pic)(Flrpic): Investigations by High-Resolution Optical Spectroscopy", Inorg. Chem. (Inorganic Chemistry), 2009, vol. 48, No. 5, pp. 1928-1937.

Gong.X et al., "Phosphorescence from iridium complexes doped into polymer blends", J. Appl. Phys. (Journal of Applied Physics), Feb. 1, 2004, vol. 95, No. 3, pp. 948-953.

Zhao.Q et al., "Synthesis and Photophysical, Electrochemical, and Electrophosphorescent Properties of a Series of Iridium(III) Complexes Based on Quinoline Derivatives and Different β-Diketonate Ligands", Organometallics, Jun. 14, 2006, vol. 25, No. 15, pp. 3631-3638.

Hino.Y et al., "Red Phosphorescent Organic Light-Emitting Diodes Using Mixture System of Small-Molecule and Polymer Host", Jpn. J. Appl. Phys. (Japanese Journal of Applied Physics), Apr. 21, 2005, vol. 44, No. 4B, pp. 2790-2794.

Tsuboyama.A et al., "Homoleptic Cyclometalated Iridium Complexes with Highly Efficient Red Phosphorescence and Application to Organic Light-Emitting Diode", J. Am. Chem. Soc. (Journal of the American Chemical Society), 2003, vol. 125, No. 42, pp. 12971-12979.

Kondakova.M et al., "High-efficiency, low-voltage phosphorescent organic light-emitting diode devices with mixed host", J. Appl. Phys. (Journal of Applied Physics), Nov. 4, 2008, vol. 104, pp. 094501-1-094501-17.

(56) References Cited

OTHER PUBLICATIONS

Chen.F et al., "Triplet Exciton Confinement in Phosphorescent Polymer Light-Emitting Diodes", Appl. Phys. Lett. (Applied Physics Letters), Feb. 17, 2003, vol. 82, No. 7, pp. 1006-1008.

Lee.J et al., "Stabilizing the efficiency of phosphorescent organic light-emitting diodes", SPIE Newsroom, Apr. 21, 2008, pp. 1-3.

Tokito.S et al., "Confinement of Triplet Energy on Phosphorescent Molecules for Highly-Efficient Organic Blue-Light-Emitting Devices", Appl. Phys. Lett. (Applied Physics Letters), Jul. 21, 2003, vol. 83, No. 3, pp. 569-571.

Park.Y et al., "Efficient triplet harvesting by fluorescent molecules through exciplexes for high efficiency organic light-emitting diodes", Appl. Phys. Lett. (Applied Physics Letters), Apr. 18, 2013, vol. 102, No. 15, pp. 153306-1-153306-5.

Endo.A et al., "Thermally Activated Delayed Fluorescence from Sn4+-Porphyrin Complexes and Their Application to Organic Light Emitting Diodes—A Novel Mechanism for Electroluminescence", Adv. Mater. (Advanced Materials), Aug. 12, 2009, vol. 21, No. 47, pp. 4802-4806.

Korean Office Action (Application No. 2017-0158779) dated Jan. 21, 2018.

Takahashi.T et al., "Donor-acceptor-structured 1,4-diazatriphenylene derivatives exhibiting thermally activated delayed fluorescence: design and synthesis, photophysical properties and OLED characteristics", Science and Technology of Advanced Materials, May 27, 2014, vol. 15, No. 3, pp. 1-10.

Seo.S et al., "Exciplex-triplet energy transfer: A new method to achieve extremely efficient organic light-emitting diode with external quantum efficiency over 30% and drive voltage below 3V", Jpn. J. Appl. Phys. (Japanese Journal of Applied Physics), Mar. 17, 2014, vol. 53, No. 4, pp. 042102-1-042102-8.

Song.W et al., "Light emission mechanism of mixed host organic light-emitting diodes", Appl. Phys. Lett. (Applied Physics Letters), Mar. 1, 2015, vol. 106, No. 12, pp. 123306-1-123306-4.

Tris[2-phenylpyridinato-C2, N]iridium(III), https://www.sigmaaldrich.com/catalog/product/aldrich/688096?lang=de&region=DE.

Organic Light-emitting Materials and Devices, 2007, pp. 330-334, Taylor & Francis Group.

Rho.H et al., "Synthesis and Photophysical Studies of Iridium Complexes Having Different Ligands", Jpn. J. Appl. Phys. (Japanese Journal of Applied Physics), Jan. 20, 2006, vol. 45, No. 1B, pp. 568-573.

Negres.R et al., "Origin of efficient light emission from a phosphorescent polymer/organometallic guest-host system", Phys. Rev. B (Physical Review. B), Sep. 29, 2003, vol. 68, No. 11, pp. 115209-1-115209-8.

Gong.X et al., "High-Efficiency Polymer-Based Electrophosphorescent Devices", Adv. Mater. (Advanced Materials), Apr. 18, 2002, vol. 14, No. 8, pp. 581-585.

Hamed.Z et al., "Fluorescence quenching in PVK:ZnSe nanocomposite structure", Synthetic Metals, Jun. 12, 2014, vol. 195, pp. 102-109.

Holzer.W et al., "Absorption and emission spectroscopic characterization of Ir(ppy)3", Chemical Physics, 2005, vol. 308, No. 1-2, pp. 93-102.

Tamayo.A et al., "Synthesis and Characterization of Facial and Meridional Tris-cyclometalated Iridium (III) Complexes", J. Am. Chem. Soc. (Journal of the American Chemical Society), Jun. 18, 2003, vol. 125, No. 24, pp. 7377-7387.

Okada.S et al., "Substituent effects of iridium complexes for highly efficient red OLEDs", Dalton Transactions, May 5, 2005, No. 9, pp. 1583-1590.

Notice of Opposition (Patent No. German Patent No. 112012000831) dated Jun. 4, 2018.

Notice of Opposition (Patent No. German Patent No. 112012000828) dated Jun. 8, 2018.

Notice of Opposition (Patent No. German Patent No. 112012001364) dated Jun. 27, 2018.

Petition for Cancellation of Patent (Patent No. Korean Patent No. 10-1793880-00-00) Dated May 24, 2018.

Petition for Cancellation of Patent (Patent No. Korean Patent No. 10-1812673-00-00) Dated Jul. 6, 2018.

Written Opposition to the Grant of Patent (Patent No. Japanese Patent No. 5981726) dated Feb. 28, 2017.

Xu.Y et al., "Efficient polymer white-light-emitting diodes with a phosphorescent dopant", Semicond. Sci. Technol.(Semiconductor Science and Technology), Aug. 14, 2006, vol. 21, No. 10, pp. 1373-1376.

Williams.J et al., "Light-emitting iridium complexes with tridentate ligands", Dalton Transactions, Feb. 19, 2008, No. 16, pp. 2081-2099.

Misra.A et al., "White organic LEDs and their recent advancements", Semicond. Sci. Technol. (Semiconductor Science and Technology), Apr. 25, 2006, vol. 21, No. 7, pp. R35-R47.

Ku.S et al., "Spiro-Configured Bipolar Host Materials for Highly Efficient Electrophosphorescent Devices", Chemistry—An Asian Journal, Oct. 13, 2011, vol. 7, No. 1, pp. 133-142.

Chaskar.A et al., "Bipolar Host Materials: A Chemical Approach for Highly Efficient Electrophosphorescent Devices", Adv. Mater. (Advanced Materials), Aug. 1, 2011, vol. 23, No. 34, pp. 3876-3895.

Ye.Z et al., "Low energy consumption phosphorescent organic light-emitting diodes using phenyl anthracenone derivatives as the host featuring bipolar and thermally activated delayed fluorescence", RSC Advances, Feb. 27, 2019, vol. 9, No. 12, pp. 6881-6889.

Nakagawa.T et al., "Electroluminescence based on thermally activated delayed fluorescence generated by a spirobifluorene donor-acceptor structure", Chemical Communications, Apr. 17, 2012, vol. 48, No. 77, pp. 9580-9582, RSC Publishing.

Chien.C et al., "Electrophosphorescent Polyfluorenes Containing Osmium Complexes in the Conjugated Backbone", Adv. Funct. Mater. (Advanced Functional Materials), May 13, 2008, vol. 18, No. 9, pp. 1430-1439.

Milian-Medina.B et al., "Computational design of low singlet-triplet gap all-organic molecules for OLED application", Organic Electronics, Jun. 1, 2012, vol. 13, No. 6, pp. 985-991.

Hung.W et al., "An ambipolar host material provides highly efficient saturated red PhOLEDs possessing simple device structures", Physical Chemistry Chemical Physics, 2008, vol. 10, No. 38, pp. 5822-5825.

Nakagawa.T et al., "Control of Energy Levels in Organic Light-emitting Materials aimed for New Light Emitting Mechanism", Fine Chemica, Jan. 15, 2012, vol. 41, No. 2, pp. 34-40, CMC.

\* cited by examiner

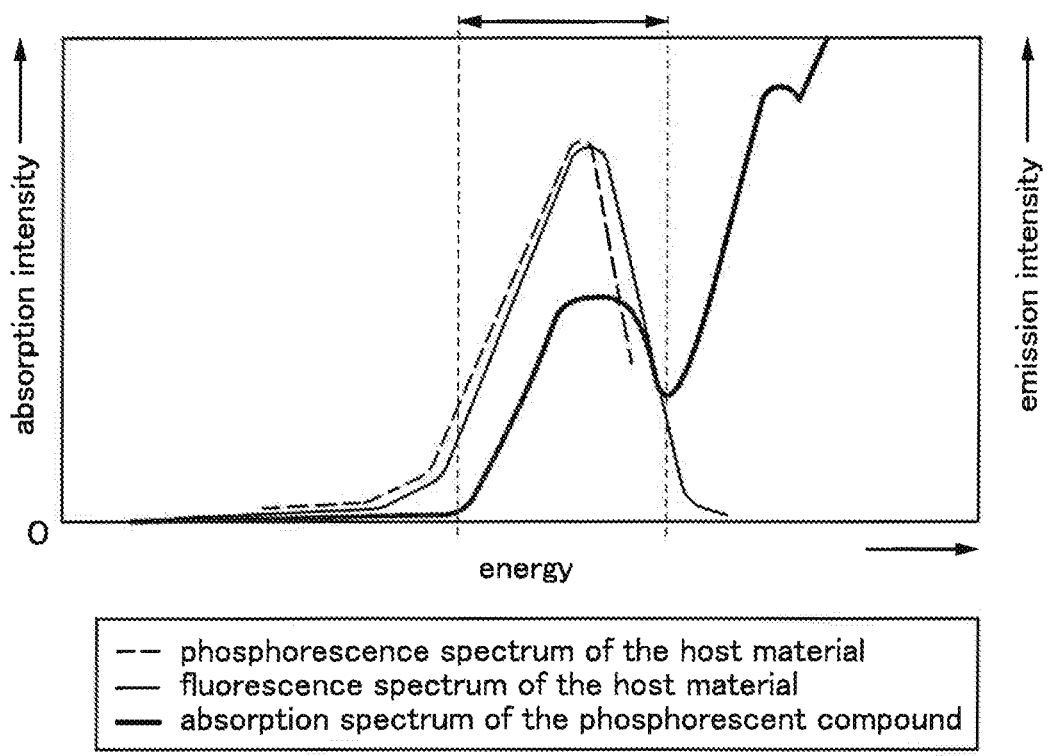

LIGHT-EMITTING ELEMENT

CROSS-REFERENCE TO RELATED APPLICATIONS

This application is a continuation of U.S. application Ser. No. 16/879,819, filed May 21, 2020, now allowed, which is a continuation of U.S. application Ser. No. 16/188,493, filed Nov. 13, 2018, now U.S. Pat. No. 10,693,093, which is a continuation of U.S. application Ser. No. 15/584,830, filed May 2, 2017, now U.S. Pat. No. 10,326,093, which is a continuation of U.S. application Ser. No. 15/293,744, filed Oct. 14, 2016, now U.S. Pat. No. 9,673,404, which is a continuation of U.S. application Ser. No. 14/657,384, filed Mar. 13, 2015, now U.S. Pat. No. 9,478,764, which is a continuation of U.S. application Ser. No. 13/760,301, filed Feb. 6, 2013, now U.S. Pat. No. 8,981,355, which claims the benefit of a foreign priority application filed in Japan as Serial No. 2012-025834 on Feb. 9, 2012, all of which are incorporated by reference.

1. FIELD OF THE INVENTION

The present invention relates to light-emitting elements using an organic electroluminescence (EL) phenomenon (hereinafter such light-emitting elements are also referred to as organic EL elements).

2. DESCRIPTION OF THE RELATED ART

An organic EL element has been actively researched and developed. In a fundamental structure of the organic EL element, a light-emitting layer containing a light-emitting material is interposed between a pair of electrodes. The organic EL element has attracted attention as a next-generation flat panel display element owing to characteristics such as feasibility of being thinner and lighter, high speed response to input signals, and capability of direct current low voltage driving. In addition, a display using such a light-emitting element has a feature that it is excellent in contrast and image quality, and has a wide viewing angle. Further, being a plane light source, the organic EL element has been attempted to be applied as a light source such as a backlight of a liquid crystal display and a lighting device.

The emission mechanism of the organic EL element is of a carrier-injection type. That is, by application of voltage with a light-emitting layer interposed between electrodes, electrons and holes injected from the electrodes are recombined to make a light-emitting material excited, and light is emitted when the excited state relaxes to the ground state. There can be two types of the excited states: a singlet excited state ($S^*$) and a triplet excited state ($T^*$). The statistical generation ratio of the excited states in a light-emitting element is considered to be $S^*:T^*=1:3$.

In general, the ground state of a light-emitting organic compound is a singlet state. Therefore, light emission from the singlet excited state ($S^*$) is referred to as fluorescence because it is caused by electron transition between the same spin multiplicities. On the other hand, light emission from the triplet excited state ($T^*$) is referred to as phosphorescence where electron transition occurs between different spin multiplicities. Here, in a compound exhibiting fluorescence (hereinafter referred to as fluorescent compound), in general, phosphorescence is not observed at room temperature, and only fluorescence is observed. Accordingly, the internal quantum efficiency (the ratio of generated photons to injected carriers) in a light-emitting element containing a fluorescent compound is assumed to have a theoretical limit of 25% based on $S^*:T^*=1:3$.

On the other hand, when a compound exhibiting phosphorescence (hereinafter referred to as a phosphorescent compound) is used, the internal quantum efficiency can be theoretically increased to 100%. That is, higher emission efficiency can be obtained than using a fluorescent compound. For these reasons, a light-emitting element containing a phosphorescent compound has been actively developed in recent years in order to achieve a high-efficiency light-emitting element. As the phosphorescent compound, an organometallic complex that has iridium or the like as a central metal has particularly attracted attention because such an organometallic complex has a high phosphorescence quantum yield. For example, an organometallic complex that has iridium as a central metal is disclosed as a phosphorescent material in Patent Document 1.

When a light-emitting layer of a light-emitting element is formed using the above-described phosphorescent compound, in order to suppress concentration quenching or quenching due to triplet-triplet annihilation of the phosphorescent compound, the light-emitting layer is often formed such that the phosphorescent compound is dispersed in a matrix of another compound. Here, the compound serving as the matrix is called a host material, and the compound dispersed in the matrix, such as a phosphorescent compound, is called a guest material.

REFERENCE

Patent Document

[Patent Document 1] International Publication WO 00/70655 pamphlet

SUMMARY OF THE INVENTION

However, it is generally said that the light extraction efficiency of an organic EL element is approximately 20% to 30%. Accordingly, considering light absorption by a reflective electrode and a transparent electrode, the external quantum efficiency of a light-emitting element containing a phosphorescent compound has a limit of approximately 25% at most.

Further, as described above, application of organic EL elements to displays and lightings has been considered. One of objects here is a reduction in power consumption. In order to reduce power consumption, it is required to reduce the drive voltage of the organic EL element.

An object of one embodiment of the present invention is to provide a light-emitting element with high external quantum efficiency. Further, an object of one embodiment of the present invention is to provide a light-emitting element with a low drive voltage.

Note that the invention to be disclosed below aims to achieve at least one of the above-described objects.

One embodiment of the present invention is a light-emitting element including a light-emitting layer which contains a phosphorescent compound and a thermally activated delayed fluorescence material, which is a material exhibiting thermally activated delayed fluorescence (TADF), between a pair of electrodes, wherein a peak of a fluorescence spectrum of the material exhibiting thermally activated delayed fluorescence overlaps with a lowest-energy-side absorption band in an absorption spectrum of the phosphorescent compound, and wherein the phosphorescent compound exhibits phosphorescence in the light-emitting layer by voltage application between the pair of electrodes.

Note that in the present specification and the like, a fluorescence spectrum of a material exhibiting thermally activated delayed fluorescence includes a delayed fluorescence spectrum (thermally activated delayed fluorescence spectrum).

Here, the term "delayed fluorescence" refers to light emission having the same spectrum as normal fluorescence and an extremely long lifetime. The lifetime is $10^{-6}$ seconds or longer, preferably $10^{-3}$ seconds or longer.

In the above light-emitting element, the difference between the energy value of the peak of the fluorescence spectrum of the material exhibiting thermally activated delayed fluorescence and the energy value of a peak of the lowest-energy-side absorption band in the absorption spectrum of the phosphorescent compound is preferably 0.3 eV or less.

Further, one embodiment of the present invention is a light-emitting element including a light-emitting layer which contains a phosphorescent compound and a material exhibiting thermally activated delayed fluorescence between a pair of electrodes, wherein a peak of a phosphorescence spectrum of the material exhibiting thermally activated delayed fluorescence overlaps with a lowest-energy-side absorption band in an absorption spectrum of the phosphorescent compound, and wherein the phosphorescent compound exhibits phosphorescence in the light-emitting layer by voltage application between the pair of electrodes.

In the above light-emitting element, the difference between the energy value of the peak of the phosphorescence spectrum of the material exhibiting thermally activated delayed fluorescence and the energy value of a peak of the lowest-energy-side absorption band in the absorption spectrum of the phosphorescent compound is preferably 0.3 eV or less.

Further, one embodiment of the present invention is a light-emitting element including a light-emitting layer which contains a phosphorescent compound and a material exhibiting thermally activated delayed fluorescence between a pair of electrodes, wherein a peak of a fluorescence spectrum and a peak of a phosphorescence spectrum of the material exhibiting thermally activated delayed fluorescence each overlap with a lowest-energy-side absorption band in an absorption spectrum of the phosphorescent compound, and wherein the phosphorescent compound exhibits phosphorescence in the light-emitting layer by voltage application between the pair of electrodes.

In the above light-emitting element, the difference between the energy value of the peak of the fluorescence spectrum of the material exhibiting thermally activated delayed fluorescence and the energy value of a peak of the lowest-energy-side absorption band in the absorption spectrum of the phosphorescent compound, and the difference between the energy value of the peak of the phosphorescence spectrum of the material exhibiting thermally activated delayed fluorescence and the energy value of the peak of the lowest-energy-side absorption band in the absorption spectrum of the phosphorescent compound, are each preferably 0.3 eV or less.

In the above light-emitting element, the difference between the energy value of the peak of the fluorescence spectrum and the energy value of the peak of the phosphorescence spectrum of the material exhibiting thermally activated delayed fluorescence is preferably 0.3 eV or less.

In any of the above light-emitting elements, the lowest-energy-side absorption band in the absorption spectrum of the phosphorescent compound preferably includes an absorption band based on a triplet MLCT (metal to ligand charge transfer) transition.

In any of the above light-emitting elements, the phosphorescent compound is preferably an organometallic complex, more preferably an iridium complex.

In any of the above light-emitting elements, the molar absorption coefficient of the lowest-energy-side absorption band in the absorption spectrum of the phosphorescent compound is preferably higher than or equal to 5000/M·cm.

In any of the above light-emitting elements, the material exhibiting thermally activated delayed fluorescence is preferably a heterocyclic compound including a π-electron excess heteroaromatic ring and a π-electron deficient heteroaromatic ring, more preferably a heterocyclic compound in which the π-electron excess heteroaromatic ring is directly bonded to the π-electron deficient heteroaromatic ring.

The light-emitting element of one embodiment of the present invention can be applied to a light-emitting device, an electronic device, and a lighting device.

According to one embodiment of the present invention, a light-emitting element with high external quantum efficiency can be provided. According to another embodiment of the present invention, a light-emitting element with a low drive voltage can be provided.

BRIEF DESCRIPTION OF THE DRAWINGS

In the accompanying drawings:

FIG. 1 shows a concept of one embodiment of the present invention; and

DETAILED DESCRIPTION OF THE INVENTION

Figure 2A:
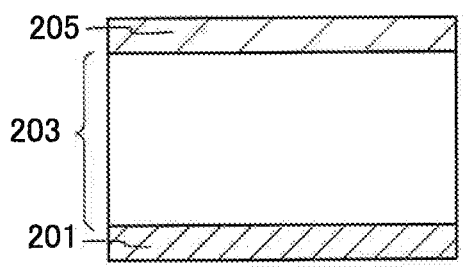
FIGS. 2A to 2F illustrate light-emitting elements of embodiments of the present invention.

Embodiments of the present invention will be described in detail with reference to the accompanying drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.

Embodiment 1

In this embodiment, a light-emitting element of one embodiment of the present invention will be described with reference to FIG. 1.

The light-emitting element of one embodiment of the present invention includes a light-emitting layer containing a guest material, i.e., a light-emitting material, and a host material in which the guest material is dispersed. As the guest material, a phosphorescent compound is used. As the host material, a material exhibiting thermally activated delayed fluorescence is used. FIG. 1 shows a conceptual schematic view of a phosphorescence spectrum and a fluorescence spectrum of the host material in the light-emitting element of one embodiment of the present invention and an absorption spectrum of the phosphorescent compound. In FIG. 1, the vertical axes represent absorption intensity and emission intensity, and the horizontal axis represents energy.

In the light-emitting layer in the light-emitting element of one embodiment of the present invention, the content of the host material is higher than that of the guest material. The structure in which the guest material is dispersed in the host material can prevent the light-emitting layer from crystallizing. Further, it is possible to suppress concentration quenching due to high concentration of the guest material, and thus the light-emitting element can have higher emission efficiency.

According to this embodiment, it is preferable that the level of a triplet excitation energy ($T_1$ level) of the host material be higher than that of the guest material. This is because, when the $T_1$ level of the host material is lower than that of the guest material, the triplet excitation energy of the guest material, which is to contribute to light emission, is quenched by the host material and accordingly the emission efficiency is decreased.

(Elementary Processes of Light Emission)

First, a description is given of general elementary processes of light emission in a light-emitting element using a phosphorescent compound as a guest material.

(1) The case where an electron and a hole are recombined in a guest molecule, and the guest molecule is excited (direct recombination process).

(1-1) When the excited state of the guest molecule is a triplet excited state, the guest molecule emits phosphorescence.

(1-2) When the excited state of the guest molecule is a singlet excited state, the guest molecule in the singlet excited state undergoes intersystem crossing to a triplet excited state and emits phosphorescence.

In other words, in the direct recombination process in (1), as long as the efficiency of intersystem crossing and the phosphorescence quantum yield of the guest molecule are high, high emission efficiency can be obtained. As described above, it is preferable that the $T_1$ level of the host molecule be higher than that of the guest molecule.

(2) The case where an electron and a hole are recombined in a host molecule and the host molecule is excited (energy transfer process).

(2-1) When the excited state of the host molecule is a triplet excited state and the $T_1$ level of the host molecule is higher than that of the guest molecule, an excitation energy transfers from the host molecule to the guest molecule, and thus, the guest molecule is put in a triplet excited state. The guest molecule in the triplet excited state exhibits phosphorescence. Note that the energy can transfer to a singlet excitation energy level ($S_1$ level) of the guest molecule in theory; however, since the $S_1$ level of the guest molecule has a higher energy than the $T_1$ level of the host molecule in many cases, energy transfer to the $S_1$ level of the guest molecule is barely likely to be a main energy transfer process; therefore, a description thereof is not given here.

(2-2) When the excited state of the host molecule is a singlet excited state and the $S_1$ level of the host molecule is higher than the $S_1$ level and $T_1$ level of the guest molecule, an excitation energy transfers from the host molecule to the guest molecule, and thus, the guest molecule is put in a singlet excited state or a triplet excited state. The guest molecule in the triplet excited state exhibits phosphorescence. In addition, the guest molecule in the singlet excited state undergoes intersystem crossing to a triplet excited state and emits phosphorescence.

In other words, in the energy transfer process in (2), it is important how efficiently both the triplet excitation energy and the singlet excitation energy of the host molecule can transfer to the guest molecule.

(Energy Transfer Process)

The following will show energy transfer processes between molecules in detail.

First, as a mechanism of energy transfer between molecules, the following two mechanisms are proposed. A molecule donating excitation energy is referred to as a host molecule, while a molecule accepting the excitation energy is referred to as a guest molecule.

(Förster Mechanism (Dipole-Dipole Interaction))

In Förster mechanism (also referred to as Förster resonance energy transfer), direct intermolecular contact is not necessary for energy transfer. Through a resonant phenomenon of dipolar oscillation between a host molecule and a guest molecule, energy transfer occurs. The resonant phenomenon of dipolar oscillation causes the host molecule to donate energy to the guest molecule; thus, the host molecule relaxes to a ground state and the guest molecule is excited. The rate constant $k_{h^* \to g}$ of Förster mechanism is expressed by a formula (1).

[FORMULA 1]

$$k_{h^* \to g} = \frac{9000 c^4 \kappa^2 \phi \ln 10}{128 \pi^5 n^4 N \tau R^6} \int \frac{f'_h(v) \varepsilon_g(v)}{v^4} dv \quad (1)$$

In the formula (1), v denotes a frequency, $f'_h(v)$ denotes a normalized emission spectrum of a host molecule (a fluorescence spectrum in energy transfer from a singlet excited state, and a phosphorescence spectrum in energy transfer from a triplet excited state), $\varepsilon_g(v)$ denotes a molar absorption coefficient of a guest molecule, N denotes Avogadro's number, n denotes a refractive index of a medium, R denotes an intermolecular distance between the host molecule and the guest molecule, τ denotes a measured lifetime of an excited state (fluorescence lifetime or phosphorescence lifetime), c denotes the speed of light, ϕ denotes a luminescence quantum yield (a fluorescence quantum yield in energy transfer from a singlet excited state, and a phosphorescence quantum yield in energy transfer from a triplet excited state), and $\kappa^2$ denotes a coefficient (0 to 4) of orientation of a transition dipole moment between the host molecule and the guest molecule. Note that $\kappa^2 = 2/3$ in random orientation.

(Dexter Mechanism (Electron Exchange Interaction))

In Dexter mechanism (also referred to as Dexter electron transfer), a host molecule and a guest molecule are close to a contact effective range where their orbitals overlap, and the host molecule in an excited state and the guest molecule in a ground state exchange their electrons, which leads to energy transfer. The rate constant $k_{h^* \to g}$ of Dexter mechanism is expressed by a formula (2).

[FORMULA 2]

$$k_{h^* \to g} = \left(\frac{2\pi}{h}\right) K^2 \exp\left(-\frac{2R}{L}\right) \int f'_h(v) \varepsilon'_g(v) dv \quad (2)$$

In the formula (2), h denotes a Planck constant, K denotes a constant having an energy dimension, v denotes a frequency, $f'_h(v)$ denotes a normalized emission spectrum of a host molecule (a fluorescence spectrum in energy transfer from a singlet excited state, and a phosphorescence spectrum in energy transfer from a triplet excited state), $\varepsilon'_g(v)$ denotes a normalized absorption spectrum of a guest molecule, L denotes an effective molecular radius, and R denotes an intermolecular distance between the host molecule and the guest molecule.

Here, the efficiency of energy transfer from the host molecule to the guest molecule (energy transfer efficiency $\Phi_{ET}$) is thought to be expressed by a formula (3). In the formula, $k_r$ denotes a rate constant of a light-emission process (fluorescence in energy transfer from a singlet excited state, and phosphorescence in energy transfer from a triplet excited state) of the host molecule, $k_n$ denotes a rate constant of a non-light-emission process (thermal deactivation or intersystem crossing) of the host molecule, and $\tau$ denotes a measured lifetime of the excited state of the host molecule.

[FORMULA 3]

$$\Phi_{ET} = \frac{k_{h^* \to g}}{k_r + k_n + k_{h^* \to g}} = \frac{k_{h^* \to g}}{\left(\frac{1}{\tau}\right) + k_{h^* \to g}} \quad (3)$$

First, according to the formula (3), in order to increase the energy transfer efficiency $\Phi_{ET}$, the rate constant $k_{h^* \to g}$ of energy transfer may be further increased as compared with another rate constant $k_r + k_n (= 1/\tau)$. Then, in order to increase the rate constant $k_{h^* \to g}$ of energy transfer, based on the formulas (1) and (2), in both Förster mechanism and Dexter mechanism, it is preferable that an emission spectrum of a host molecule (a fluorescence spectrum in energy transfer from a singlet excited state, and phosphorescence spectrum in energy transfer from a triplet excited state) largely overlap with an absorption spectrum of a guest molecule.

Here, the present inventor has considered that a lowest-energy-side (longest-wavelength-side) absorption band in the absorption spectrum of the guest molecule is important in considering the overlap between the emission spectrum of the host molecule and the absorption spectrum of the guest molecule.

In this embodiment, a phosphorescent compound is used as the guest material. In an absorption spectrum of the phosphorescent compound, an absorption band that is considered to contribute to light emission most greatly includes an absorption wavelength corresponding to direct transition from a singlet ground state to a triplet excitation state and the vicinity of the absorption wavelength. The absorption band is on the longest wavelength side (lowest energy side). Therefore, it is considered preferable that the emission spectrum (a fluorescence spectrum and a phosphorescence spectrum) of the host material overlap with the lowest-energy-side absorption band in the absorption spectrum of the phosphorescent compound.

For example, most organometallic complexes, especially light-emitting iridium complexes, have a broad absorption band around 2.0 eV to 2.5 eV as the lowest-energy-side absorption band (as a matter of fact, the broad absorption band can be on a lower or higher energy side). This absorption band is mainly based on a triplet MLCT transition. Note that it is considered that the absorption band also includes absorption bands based on a triplet π-π* transition and a singlet MLCT transition, and that these absorption bands overlap with each other to form a broad absorption band on the lowest energy side in the absorption spectrum. In other words, it is considered that the difference between the lowest singlet excited state and the lowest triplet excited state is small, and absorption bands based on these states overlap with each other to form a broad absorption band on the lowest energy side in the absorption spectrum. Therefore, as described above, when an organometallic complex (especially iridium complex) is used as the guest material, it is preferable that the lowest-energy-side broad absorption band largely overlap with the emission spectrum of the host material.

From the above discussion, it is preferable that, in energy transfer from the host material in a triplet excited state, the phosphorescence spectrum of the host material and the lowest-energy-side absorption band of the guest material largely overlap with each other. It is also preferable that, in energy transfer from the host material in a singlet excited state, the fluorescence spectrum of the host material and the lowest-energy-side absorption band of the guest material largely overlap with each other.

That is, in order to efficiently perform energy transfer from the host material regardless of being in the triplet excited state or the singlet excited state, it is clear from the above discussion that the host material needs to be designed so as to have both the phosphorescence spectrum and fluorescence spectrum overlapping with the lowest-energy-side absorption band of the guest material.

However, the $S_1$ level generally differs greatly from the $T_1$ level ($S_1$ level>$T_1$ level); therefore, the fluorescence emission wavelength also differs greatly from the phosphorescence emission wavelength (fluorescence emission wavelength<phosphorescence emission wavelength). For example, 4,4'-di(N-carbazolyl)biphenyl (abbreviation: CBP), which is commonly used as a host material in a light-emitting element containing a phosphorescent compound, has a phosphorescence spectrum around 500 nm (about 3.1 eV) and a fluorescence spectrum around 400 nm (about 2.5 eV), which are largely different by about 100 nm (the difference is 0.6 eV or more in energy). This example also shows that it is extremely difficult to design a host material so as to have its fluorescence spectrum in a position similar to that of its phosphorescence spectrum.

Here, the light-emitting element of one embodiment of the present invention contains a material exhibiting thermally activated delayed fluorescence as a host material.

One embodiment of the present invention is a light-emitting element including a light-emitting layer which contains a phosphorescent compound and a material exhibiting thermally activated delayed fluorescence between a pair of electrodes, wherein a peak of a fluorescence spectrum of the material exhibiting thermally activated delayed fluorescence overlaps with a lowest-energy-side absorption band in an absorption spectrum of the phosphorescent compound, and wherein the phosphorescent compound exhibits phosphorescence in the light-emitting layer by voltage application between the pair of electrodes.

Another embodiment of the present invention is a light-emitting element including a light-emitting layer which contains a phosphorescent compound and a material exhibiting thermally activated delayed fluorescence between a pair of electrodes, wherein a peak of a phosphorescence spectrum of the material exhibiting thermally activated delayed fluorescence overlaps with a lowest-energy-side absorption band in an absorption spectrum of the phosphorescent compound, and wherein the phosphorescent compound exhibits phosphorescence in the light-emitting layer by voltage application between the pair of electrodes.

The material exhibiting thermally activated delayed fluorescence has a small difference between the lowest triplet excitation energy and the lowest singlet excitation energy. In other words, the emission spectrum of the material exhibiting thermally activated delayed fluorescence from the singlet state and the emission spectrum thereof from the triplet state are close to each other. Therefore, when a peak of a fluorescence or phosphorescence spectrum of the material exhibiting thermally activated delayed fluorescence is designed so as to overlap with the lowest-energy-side absorption band of the phosphorescent compound, both the fluorescence and phosphorescence spectra of the material exhibiting thermally activated delayed fluorescence overlap with (or become very close to) the lowest-energy-side absorption band of the phosphorescent compound (see FIG. 1). This means that energy can efficiently transfer to the phosphorescent compound from the material exhibiting thermally activated delayed fluorescence regardless of being in the singlet state or in the triplet state.

Since the peak of the fluorescence or phosphorescence spectrum of the material exhibiting thermally activated delayed fluorescence overlaps with the lowest-energy-side absorption band in the absorption spectrum of the phosphorescent compound, energy smoothly transfers from the material exhibiting thermally activated delayed fluorescence, regardless of being in the singlet excited state or in the triplet excited state, to the phosphorescent compound. As a result, the light-emitting element of one embodiment of the present invention has high energy transfer efficiency. Thus, according to one embodiment of the present invention, a light-emitting element with high external quantum efficiency can be achieved.

In view of the above-described energy transfer processes, before the excitation energy of the host molecule transfers to the guest molecule, when the host molecule itself is deactivated by emitting the excitation energy as light or heat, the emission efficiency is decreased and the lifetime is shortened. According to one embodiment of the present invention, however, the energy smoothly transfers, so that the deactivation of the excitation energy can be suppressed. Thus, a light-emitting element with a long lifetime can be achieved.

Here, it is preferable that the peak of the fluorescence spectrum of the material exhibiting thermally activated delayed fluorescence be not too high (the wavelength thereof be not too short) because in that case a higher voltage is required to transfer energy from the material exhibiting thermally activated delayed fluorescence to the phosphorescent compound so that the phosphorescent compound can emit light, resulting in extra energy consumption.

In this light, in one embodiment of the present invention, the energy of the peak of the fluorescence spectrum of the material exhibiting thermally activated delayed fluorescence is preferably as low as possible (the wavelength thereof is preferably as long as possible) because in that case the emission starting voltage of the light-emitting element is low. Since the energy of the peak of the fluorescence spectrum of the material exhibiting thermally activated delayed fluorescence is low, the light-emitting element of one embodiment of the present invention is driven at a low voltage and has high emission efficiency (high external quantum efficiency), and thus has high power efficiency.

Further, in this light, within a range where the peak of the fluorescence or phosphorescence spectrum of the material exhibiting thermally activated delayed fluorescence overlaps with the lowest-energy-side absorption band in the absorption spectrum of the phosphorescent compound, the energy of the peak of the fluorescence spectrum may be lower than that of a peak of the absorption band. This is because in this case, the light-emitting element can be driven at a low voltage with relatively high energy efficiency kept.

In particular, both the peaks of the fluorescence and phosphorescence spectra of the material exhibiting thermally activated delayed fluorescence preferably overlap with the lowest-energy-side absorption band in the absorption spectrum of the phosphorescent compound, because in that case a light-emitting element with particularly high energy transfer efficiency and particularly high external quantum efficiency can be achieved.

Specifically, another embodiment of the present invention is a light-emitting element including a light-emitting layer which contains a phosphorescent compound and a material exhibiting thermally activated delayed fluorescence between a pair of electrodes, wherein a peak of a fluorescence spectrum and a peak of a phosphorescence spectrum of the material exhibiting thermally activated delayed fluorescence each overlap with a lowest-energy-side absorption band in an absorption spectrum of the phosphorescent compound, and wherein the phosphorescent compound exhibits phosphorescence in the light-emitting layer by voltage application between the pair of electrodes.

To make the emission spectrum of the material exhibiting thermally activated delayed fluorescence overlap sufficiently with the absorption spectrum of the phosphorescent compound, the difference between the energy value of the peak of the fluorescence spectrum of the material exhibiting thermally activated delayed fluorescence and the energy value of the peak of the lowest-energy-side absorption band in the absorption spectrum of the phosphorescent compound is preferably 0.3 eV or less, more preferably 0.2 eV or less, even more preferably 0.1 eV or less. Further, the difference between the energy value of the peak of the phosphorescence spectrum of the material exhibiting thermally activated delayed fluorescence and the energy value of the peak of the lowest-energy-side absorption band in the absorption spectrum of the phosphorescent compound is preferably 0.3 eV or less, more preferably 0.2 eV or less, even more preferably 0.1 eV or less.

As described above, the lowest triplet excitation energy and the lowest singlet excitation energy of the material exhibiting thermally activated delayed fluorescence, which is used as the host material in the light-emitting element of one embodiment of the present invention, are close to each other. In particular, in the light-emitting element of one embodiment of the present invention, the difference between the energy values of the peaks of the fluorescence and phosphorescence spectra of the material exhibiting thermally activated delayed fluorescence is preferably 0.3 eV or less.

In the above light-emitting element, it is preferable that the lowest-energy-side absorption band in the absorption spectrum of the phosphorescent compound include an absorption band based on a triplet MLCT transition. A triplet MLCT excited state is the lowest triplet excited state of the phosphorescent compound which is the guest material, and thus, the phosphorescent compound exhibits phosphorescence therefrom. That is, phosphorescence from the triplet MLCT excited state involves few deactivation processes other than light emission, and thus, it is considered that high emission efficiency can be obtained by making the proportion of this excited state as high as possible. For these reasons, there are preferably many energy transfer processes where energy directly transfers from the material exhibiting thermally activated delayed fluorescence to the triplet MLCT excited state by using the absorption band based on the triplet MLCT transition. In the above light-emitting element, the phosphorescent compound is preferably an organometallic complex, more preferably an iridium complex.

Here, it is preferable that sufficient excitation energy of the material exhibiting thermally activated delayed fluorescence transfer to the phosphorescent compound, and that fluorescence (delayed fluorescence) from the singlet excited state be not substantially observed.

Further, in the energy transfer from the material exhibiting thermally activated delayed fluorescence in the singlet excited state, the Förster mechanism is considered to be important. Considering that, from the formula (1), the molar absorption coefficient of the lowest-energy-side absorption band of the phosphorescent compound is preferably 2000/M·cm or higher, more preferably 5000/M·cm or higher.

Note that this embodiment can be combined with the other embodiment as appropriate.

Embodiment 2

In Embodiment 2, light-emitting elements each according to one embodiment of the present invention will be described with reference to FIGS. 2A to 2F.

Each of the light-emitting elements shown in this embodiment includes a pair of electrodes (a first electrode and a second electrode) and an EL layer(s) provided between the pair of electrodes. One of the electrodes serves as an anode and the other serves as a cathode. The EL layer(s) includes at least a light-emitting layer, and the light-emitting layer contains a guest material, i.e., a light-emitting material, and a host material in which the guest material is dispersed. As the guest material, a phosphorescent compound is used. As the host material, a material exhibiting thermally activated delayed fluorescence is used.

The light-emitting element of one embodiment of the present invention can employ any of a top emission structure, a bottom emission structure, and a dual emission structure.

The following will show specific examples of a structure of the light-emitting element of one embodiment of the present invention.

A light-emitting element illustrated in FIG. 2A includes an EL layer 203 between a first electrode 201 and a second electrode 205. In this embodiment, the first electrode 201 serves as the anode, and the second electrode 205 serves as the cathode.

When a voltage higher than the threshold voltage of the light-emitting element is applied between the first electrode 201 and the second electrode 205, holes are injected to the EL layer 203 from the first electrode 201 side and electrons are injected to the EL layer 203 from the second electrode 205 side. The injected electrons and holes are recombined in the EL layer 203 and a light-emitting material contained in the EL layer 203 emits light.

The EL layer 203 includes at least a light-emitting layer, as described above. In addition to the light-emitting layer, the EL layer 203 may further include one or more layers containing any of a material with a high hole-injection property, a material with a high hole-transport property, a hole-blocking material, a material with a high electron-transport property, a material with a high electron-injection property, a bipolar property (a material with a high electron- and hole-transport property), and the like.

A known material can be used for the EL layer 203. Either a low molecular compound or a high molecular compound can be used, and an inorganic compound may also be used.

Figure 2B:
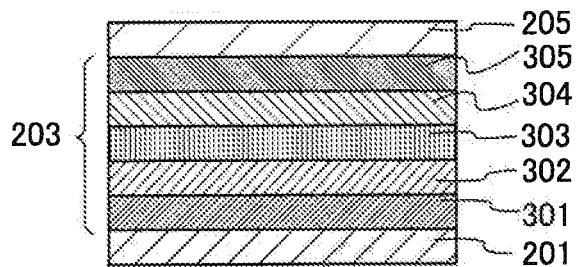

A specific example of a structure of the EL layer 203 is illustrated in FIG. 2B. In the EL layer 203 illustrated in FIG. 2B, a hole-injection layer 301, a hole-transport layer 302, a light-emitting layer 303, an electron-transport layer 304, and an electron-injection layer 305 are stacked in this order from the first electrode 201 side.

Figure 2C:
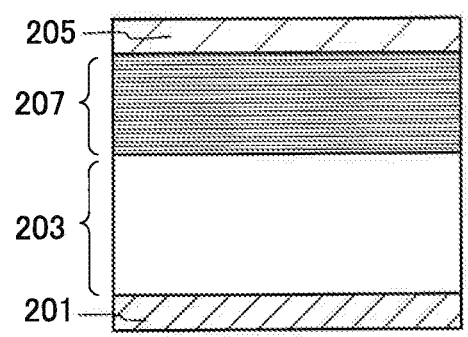

A light-emitting element illustrated in FIG. 2C includes the EL layer 203 between the first electrode 201 and the second electrode 205, and further includes an intermediate layer 207 between the EL layer 203 and the second electrode 205.

Figure 2D:
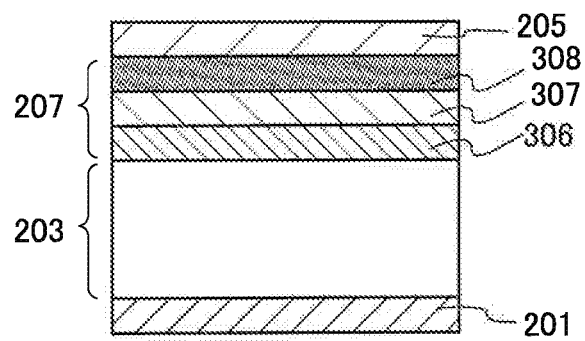

A specific example of a structure of the intermediate layer 207 is illustrated in FIG. 2D. The intermediate layer 207 includes at least a charge-generation region 308. In addition to the charge-generation region 308, the intermediate layer 207 may further include an electron-relay layer 307 and an electron-injection buffer layer 306.

When a voltage higher than the threshold voltage of the light-emitting element is applied between the first electrode 201 and the second electrode 205, holes and electrons are generated in the charge-generation region 308, and the holes move into the second electrode 205 and the electrons move into the electron-relay layer 307. The electron-relay layer 307 has a high electron-transport property and immediately transfers the electrons generated in the charge-generation region 308 to the electron-injection buffer layer 306. The electron-injection buffer layer 306 reduces a barrier to electron injection into the EL layer 203, so that the efficiency of the electron injection into the EL layer 203 is increased. Thus, the electrons generated in the charge-generation region 308 are injected into the LUMO level of the EL layer 203 through the electron-relay layer 307 and the electron-injection buffer layer 306.

In addition, the electron-relay layer 307 can prevent reaction at the interface between a material contained in the charge-generation region 308 and a material contained in the electron-injection buffer layer 306. Thus, it is possible to prevent interaction such as damaging the functions of the charge-generation region 308 and the electron-injection buffer layer 306.

Figure 2E:
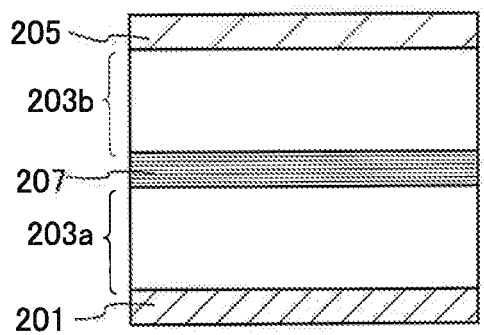
Figure 2F:
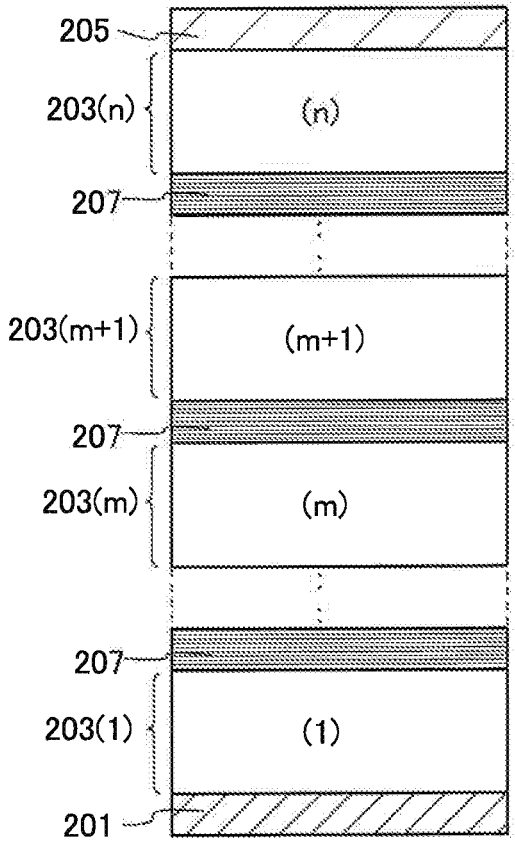

As illustrated in light-emitting elements in FIGS. 2E and 2F, a plurality of EL layers may be stacked between the first electrode 201 and the second electrode 205. In this case, the intermediate layer 207 is preferably provided between the stacked EL layers. For example, the light-emitting element illustrated in FIG. 2E includes the intermediate layer 207 between a first EL layer 203a and a second EL layer 203b. The light-emitting element illustrated in FIG. 2F includes n EL layers (n is a natural number of 2 or more) and the intermediate layers 207, an intermediate layer 207 being between an m-th EL layer 203($m$) (m is a natural number of 1 to (n−1)) and an (m+1)-th EL layer 203($m$+1).

The following will show behaviors of electrons and holes in the intermediate layer 207 between the EL layer 203($m$) and the EL layer 203(m+1). When a voltage higher than the threshold voltage of the light-emitting element is applied between the first electrode 201 and the second electrode 205, holes and electrons are generated in the intermediate layer 207, and the holes move into the EL layer 203(m+1) provided on the second electrode 205 side and the electrons move into the EL layer 203($m$) provided on the first electrode 201 side. The holes injected into the EL layer 203(m+1) are recombined with the electrons injected from the second electrode 205 side, so that a light-emitting material contained in the EL layer 203(m+1) emits light. Further, the electrons injected into the EL layer 203($m$) are recombined with the holes injected from the first electrode 201 side, so that a light-emitting material contained in the EL layer 203(m) emits light. Thus, the holes and electrons generated in the intermediate layer 207 cause light emission in the respective EL layers.

Note that the EL layers can be provided in contact with each other as long as the same structure as the intermediate layer is formed therebetween. For example, when the charge-generation region is formed over one surface of an EL layer, another EL layer can be provided in contact with the surface.

Further, by forming EL layers to emit light of different colors from each other, a light-emitting element as a whole can provide light emission of a desired color. For example, by forming a light-emitting element having two EL layers such that the emission color of the first EL layer and the emission color of the second EL layer are complementary colors, the light-emitting element can provide white light emission as a whole. Note that the word "complementary" means color relationship in which an achromatic color is obtained when colors are mixed. That is, white light emission can be obtained by mixture of light from materials whose emission colors are complementary colors. This can be applied to a light-emitting element having three or more EL layers.

FIGS. 2A to 2F can be used in an appropriate combination. For example, the intermediate layer 207 can be provided between the second electrode 205 and the EL layer 203(n) in FIG. 2F.

Examples of materials which can be used for each layer will be described below. Note that each layer is not limited to a single layer, but may be a stack of two or more layers.
(Anode)

The electrode serving as the anode (the first electrode 201 in this embodiment) can be formed using one or more kinds of conductive metals, alloys, conductive compounds, and the like. In particular, it is preferable to use a material with a high work function (4.0 eV or more). Examples include indium tin oxide (ITO), indium tin oxide containing silicon or silicon oxide, indium zinc oxide, indium oxide containing tungsten oxide and zinc oxide, graphene, gold, platinum, nickel, tungsten, chromium, molybdenum, iron, cobalt, copper, palladium, and a nitride of a metal material (e.g., titanium nitride).

When the anode is in contact with the charge-generation region, any of a variety of conductive materials can be used regardless of their work functions; for example, aluminum, silver, an alloy containing aluminum, or the like can be used.
(Cathode)

The electrode serving as the cathode (the second electrode 205 in this embodiment) can be formed using one or more kinds of conductive metals, alloys, conductive compounds, and the like. In particular, it is preferable to use a material with a low work function (3.8 eV or less). Examples include aluminum, silver, an element belonging to Group 1 or 2 of the periodic table (e.g., an alkali metal such as lithium or cesium, an alkaline earth metal such as calcium or strontium, or magnesium), an alloy containing any of these elements (e.g., Mg—Ag or Al—Li), a rare earth metal such as europium or ytterbium, and an alloy containing any of these rare earth metals.

When the cathode is in contact with the charge-generation region, any of a variety of conductive materials can be used regardless of their work functions; for example, ITO, indium tin oxide containing silicon or silicon oxide, or the like can be used.

The light-emitting element may have a structure in which one of the anode and the cathode is formed using a conductive film that transmits visible light and the other is formed using a conductive film that reflects visible light, or a structure in which both the anode and the cathode are formed using conductive films that transmit visible light.

The conductive film that transmits visible light can be formed using, for example, indium oxide, ITO, indium zinc oxide, zinc oxide, or zinc oxide to which gallium is added. Alternatively, a film of a metal material such as gold, platinum, nickel, tungsten, chromium, molybdenum, iron, cobalt, copper, palladium, or titanium, or a nitride of any of these metal materials (e.g., titanium nitride) can be formed thin so as to have a light-transmitting property. Further alternatively, graphene or the like may be used.

The conductive film that reflects visible light can be formed using, for example, a metal material such as aluminum, gold, platinum, silver, nickel, tungsten, chromium, molybdenum, iron, cobalt, copper, or palladium; an aluminum-containing alloy (aluminum alloy) such as an alloy of aluminum and titanium, an alloy of aluminum and nickel, or an alloy of aluminum and neodymium; or a silver-containing alloy such as an alloy of silver and copper. An alloy of silver and copper is preferable because of its high heat resistance. Further, lanthanum, neodymium, or germanium may be added to the metal material or the alloy.

The electrodes may be formed separately by a vacuum evaporation method or a sputtering method. Alternatively, when a silver paste or the like is used, a coating method or an inkjet method may be used.
(Hole-Injection Layer 301)

The hole-injection layer 301 contains a material with a high hole-injection property.

Examples of the material with a high hole-injection property include metal oxides such as molybdenum oxide, titanium oxide, vanadium oxide, rhenium oxide, ruthenium oxide, chromium oxide, zirconium oxide, hafnium oxide, tantalum oxide, silver oxide, tungsten oxide, and manganese oxide.

Alternatively, it is possible to use a phthalocyanine-based compound such as phthalocyanine (abbreviation: $H_2Pc$), or copper(II) phthalocyanine (abbreviation: CuPc).

Further alternatively, it is possible to use an aromatic amine compound which is a low molecular organic compound, such as 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), or 3-[N-(1-naphthyl)-N-(9-phenylcarbazol-3-yl)amino]-9-phenylcarbazole (abbreviation: PCzPCN1).

Further alternatively, it is possible to use a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacryla mide] (abbreviation: PTPDMA), or poly[N,N'-bis(4-butylphenyl)-N,N'-bis(phenyl)benzidine] (abbreviation: Poly-TPD), or a high molecular compound to which acid is added, such as poly(3,4-ethylenedioxythiophene)/poly(styrenesulfonic acid) (PEDOT/PSS) or polyaniline/poly(styrenesulfonic acid) (PAni/PSS).

The hole-injection layer 301 may serve as the charge-generation region. When the hole-injection layer 301 in contact with the anode serves as the charge-generation region, a variety of conductive materials can be used for the anode regardless of their work functions. Materials contained in the charge-generation region will be described later.

(Hole-Transport Layer 302)

The hole-transport layer 302 contains a material with a high hole-transport property.

The material with a high hole-transport property is preferably a material with a property of transporting more holes than electrons, and is especially preferably a material with a hole mobility of $10^{-6}$ cm$^2$/V·s or more.

For example, it is possible to use an aromatic amine compound such as 4,4'-bis[N-(1-naphthyl)-N-phenylamino]biphenyl (abbreviation: NPB or α-NPB), N,N'-bis(3-methylphenyl)-N,N'-diphenyl-[1,1'-biphenyl]-4,4'-diamine (abbreviation: TPD), 4-phenyl-4'-(9-phenylfluoren-9-yl)triphenylamine (abbreviation: BPAFLP), 4,4'-bis[N-(9,9-dimethylfluoren-2-yl)-N-phenylamino]biphenyl (abbreviation: DFLDPBi), or 4,4'-bis[N-(spiro-9,9'-bifluoren-2-yl)-N-phenylamino]biphenyl (abbreviation: BSPB).

Alternatively, it is possible to use a carbazole derivative such as 4,4'-di(N-carbazolyl)biphenyl (abbreviation: CBP), 9-[4-(10-phenyl-9-anthracenyl)phenyl]-9H-carbazole (abbreviation: CzPA), or 9-phenyl-3-[4-(10-phenyl-9-anthryl)phenyl]-9H-carbazole (abbreviation: PCzPA).

Further alternatively, it is possible to use an aromatic hydrocarbon compound such as 2-tert-butyl-9,10-di(2-naphthyl)anthracene (abbreviation: t-BuDNA), 9,10-di(2-naphthyl)anthracene (abbreviation: DNA), or 9,10-diphenylanthracene (abbreviation: DPAnth).

Further alternatively, it is possible to use a high molecular compound such as PVK, PVTPA, PTPDMA, or Poly-TPD.

(Light-Emitting Layer 303)

The light-emitting layer 303 contains a guest material, i.e., a light-emitting material, and a host material in which the guest material is dispersed. As the guest material, a phosphorescent compound exhibiting phosphorescence is used. As the host material, a material exhibiting thermally activated delayed fluorescence is used.

As the phosphorescent compound, which is the guest material, an organometallic complex is preferably used, and an iridium complex is particularly preferably used. In consideration of energy transfer due to Förster mechanism described above, the molar absorption coefficient of the-lowest-energy-side absorption band of the phosphorescent compound is preferably 2000/M·cm or higher, more preferably 5000/M·cm or higher. As a compound having such a high molar absorption coefficient, a phosphorescent organometallic iridium complex having an aryl diazine (pyridazine, pyrimidine, or pyrazine to which an aryl group is bonded) as a ligand is preferably used. In particular, a phosphorescent ortho-metalated iridium complex in which a carbon atom of a phenyl group of a phenylpyrimidine derivative or a phenylpyrazine derivative is bonded to an iridium atom is preferably used. Specifically, it is possible to use bis(3,5-dimethyl-2-phenylpyrazinato)(dipivaloylmethanato)iridium(III) (abbreviation: [Ir(mppr-Me)$_2$(dpm)]), (acetylacetonato)bis(4,6-diphenylpyrimidinato)iridium(III) (another name: bis[2-(6-phenyl-4-pyrimidinyl-κN3)phenyl-κC](2,4-pentanedionato-κ$^2$O,O')iridium(III)) (abbreviation: [Ir(dppm)$_2$(acac)]), bis(2,3,5-triphenylpyrazinato)(dipivaloylmethanato)iridium(III) (abbreviation: [Ir(tppr)$_2$(dpm)]), (acetylacetonato)bis(6-methyl-4-phenylpyrimidinato)iridium(III) (another name: bis[2-(6-methyl-4-pyrimidinyl-κN3)phenyl-κC](2,4-pentanedionato-κ$^2$O,O')iridium(III) (abbreviation: [Ir(mppm)$_2$(acac)]), (acetylacetonato)bis(6-tert-butyl-4-phenylpyrimidinato)iridium(III) (another name: bis[2-(6-tert-butyl-4-pyrimidinyl-κN3)phenyl-κC](2,4-pentanedionato-κ$^2$O,O')iridium(III) (abbreviation: [Ir(tBuppm)$_2$(acac)]), or the like.

As the host material, a known material exhibiting thermally activated delayed fluorescence can be used. Examples of the material exhibiting thermally activated delayed fluorescence include a fullerene, a derivative thereof, an acridine derivative such as proflavine, and eosin.

As the material exhibiting thermally activated delayed fluorescence, a metal-containing porphyrin can be used, such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (abbreviation: SnF$_2$(Proto IX)), a mesoporphyrin-tin fluoride complex (abbreviation: SnF$_2$(Meso IX)), a hematoporphyrin-tin fluoride complex (abbreviation: SnF$_2$(Hemato IX)), a coproporphyrin tetramethyl ester-tin fluoride complex (abbreviation: SnF$_2$(Copro III-4Me)), an octaethylporphyrin-tin fluoride complex (abbreviation: SnF$_2$(OEP)), an etioporphyrin-tin fluoride complex (abbreviation: SnF$_2$(Etio I)), and an octaethylporphyrin-platinum chloride complex (abbreviation: PtCl$_2$(OEP)), which are shown in the following structural formulas.

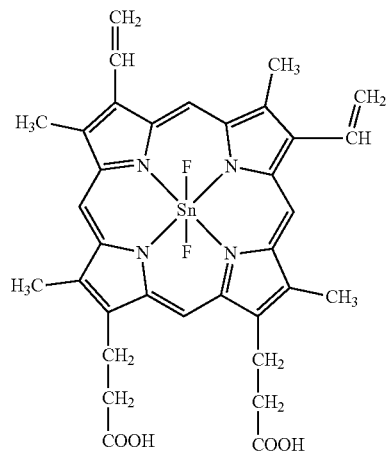

SnF$_2$(Proto IX)

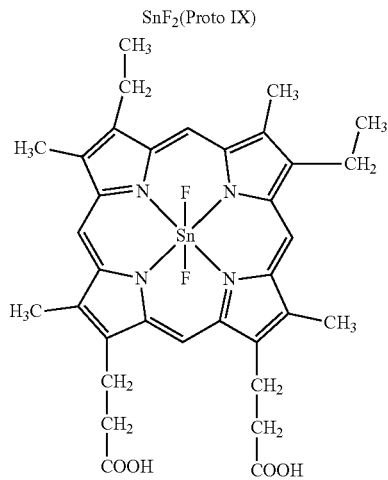

SnF$_2$(Meso IX)

-continued

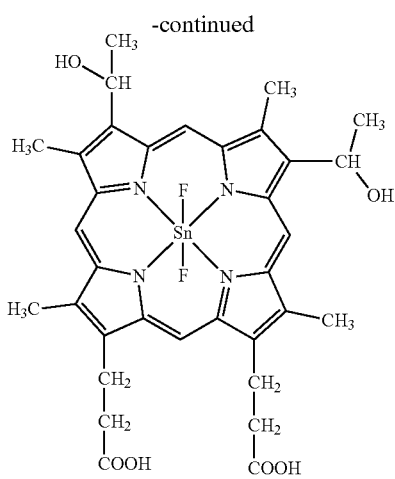

SnF₂(Hemato IX)

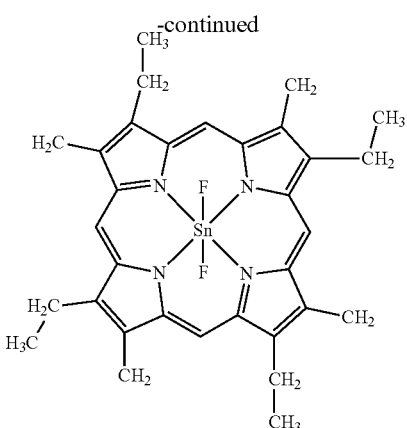

SnF₂(Etio I)

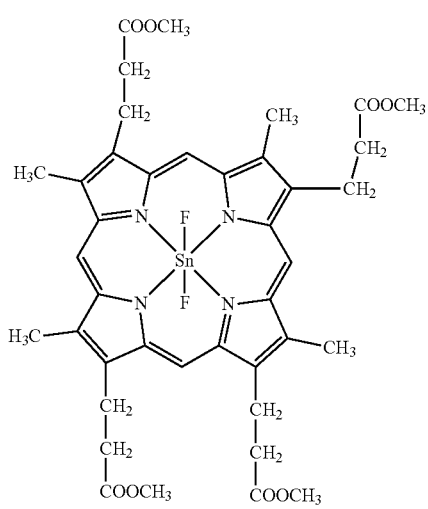

SnF₂(Copro III-4Me)

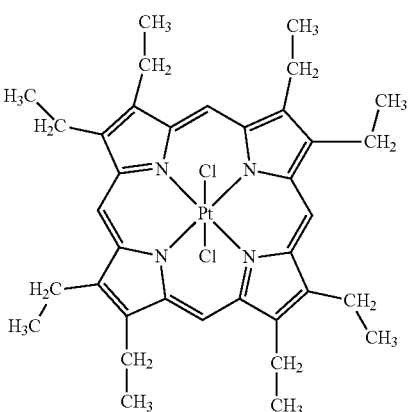

PtCl₂(OEP)

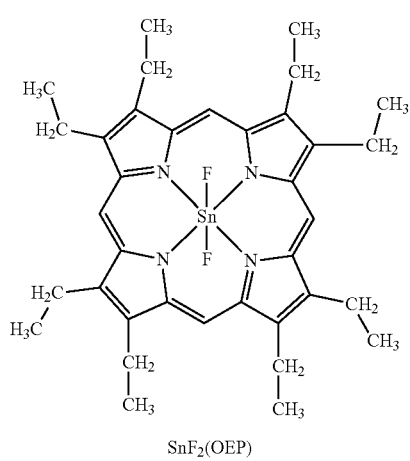

SnF₂(OEP)

Alternatively, as the material exhibiting thermally activated delayed fluorescence, a heterocyclic compound including a π-electron excess heteroaromatic ring and a π-electron deficient heteroaromatic ring can be used, such as 2-(biphenyl-4-yl)-4,6-bis(12-phenylindolo[2,3-α]carbazol-11-yl)-1,3,5-triazine (abbreviation: PIC-TRZ), which is shown in the following structural formula. The heterocyclic compound is preferably used because of the π-electron excess heteroaromatic ring and the π-electron deficient heteroaromatic ring, for which the electron-transport property and the hole-transport property are high. Note that a material in which the π-electron excess heteroaromatic ring is directly bonded to the π-electron deficient heteroaromatic ring is particularly preferably used because the donor property of the π-electron excess heteroaromatic ring and the acceptor property of the π-electron deficient heteroaromatic ring are both increased and the energy difference between the $S_1$ level and the $T_1$ level becomes small.

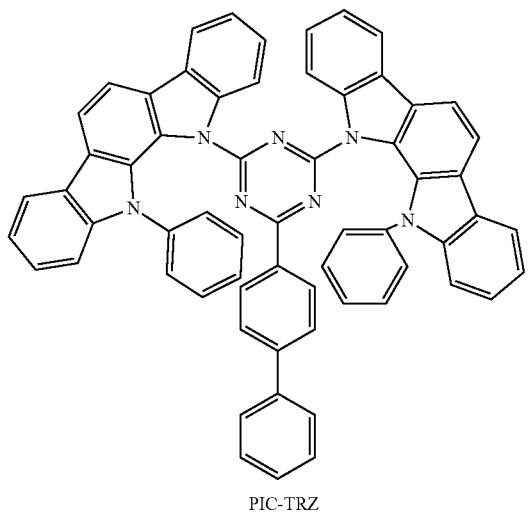 [SMILES: c1ccc(-c2ccc(-c3nc(-n4c5ccccc5c5ccc6c7ccccc7n(-c7ccccc7)c6c54)nc(-n4c5ccccc5c5ccc6c7ccccc7n(-c7ccccc7)c6c54)n3)cc2)cc1]

PIC-TRZ

Further, when a plurality of light-emitting layers are provided and emission colors of the layers are made different, light emission of a desired color can be obtained from the light-emitting element as a whole. For example, the emission colors of first and second light-emitting layers are complementary in a light-emitting element having the two light-emitting layers, so that the light-emitting element can be made to emit white light as a whole. Further, the same applies to a light-emitting element having three or more light-emitting layers.

(Electron-Transport Layer 304)

The electron-transport layer 304 contains a material with a high electron-transport property.

The material with a high electron-transport property is preferably an organic compound having a property of transporting more electrons than holes, and is especially preferably a material with an electron mobility of $10^{-6}$ cm$^2$/V·s or more.

For example, it is possible to use a metal complex such as tris(8-quinolinolato)aluminum(III) (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), bis(2-methyl-8-quinolinolato)(4-phenylphenolato)aluminum(III) (abbreviation: BAlq), bis[2-(2-hydroxyphenyl)-benzoxazolato]zinc (abbreviation: Zn(BOX)$_2$), or bis[2-(2-hydroxyphenyl)-benzothiazolato] zinc (abbreviation: Zn(BTZ)$_2$).

Alternatively, it is possible to use a heteroaromatic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), or 4,4'-bis(5-methylbenzoxazol-2-yl)stilbene (abbreviation: BzOs).

Further alternatively, it is possible to use a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py) or poly[(9,9-dioctylfluorene-2,7-diyl)-co-(2,2'-bipyridine-6,6'-diyl)] (abbreviation: PF-BPy).

(Electron-Injection Layer 305)

The electron-injection layer 305 contains a material with a high electron-injection property.

Examples of the material with a high electron-injection property include an alkali metal, an alkaline earth metal, a rare earth metal, and a compound thereof (e.g., an oxide thereof, a carbonate thereof, and a halide thereof), such as lithium, cesium, calcium, lithium oxide, lithium carbonate, cesium carbonate, lithium fluoride, cesium fluoride, calcium fluoride, and erbium fluoride.

The electron-injection layer 305 may contain the above-described material with a high electron-transport property and a donor material. For example, the electron-injection layer 305 may be formed using an Alq layer containing magnesium (Mg). When the material with a high electron-transport property and the donor material are contained, the mass ratio of the donor material to the material with a high electron-transport property is from 0.001:1 to 0.1:1.

Examples of the donor material include an alkali metal, an alkaline earth metal, a rare earth metal, and a compound thereof (e.g., an oxide thereof), such as lithium, cesium, magnesium, calcium, erbium, ytterbium, lithium oxide, calcium oxide, barium oxide, and magnesium oxide; a Lewis base; and an organic compound such as tetrathiafulvalene (abbreviation: ITF), tetrathianaphthacene (abbreviation: TTN), nickelocene, or decamethylnickelocene.

(Charge-Generation Region)

The charge-generation region included in the hole-injection layer and the charge-generation region 308 each contains a material with a high hole-transport property and an acceptor material (electron acceptor). Note that the acceptor material is preferably added so that the mass ratio of the acceptor material to the material with a high hole-transport property is 0.1:1 to 4.0:1.

The charge-generation region is not limited to a structure in which a material with a high hole-transport property and an acceptor material are contained in the same film, and may have a structure in which a layer containing a material with a high hole-transport property and a layer containing an acceptor material are stacked. Note that in the case of a stacked-layer structure in which the charge-generation region is provided on the cathode side, the layer containing the material with a high hole-transport property is in contact with the cathode, and in the case of a stacked-layer structure in which the charge-generation region is provided on the anode side, the layer containing the acceptor material is in contact with the anode.

The material with a high hole-transport property is preferably an organic compound having a property of transporting more holes than electrons, and is especially preferably an organic compound with a hole mobility of $10^{-6}$ cm$^2$/V·s or more.

Specifically, it is possible to use any of the materials with a high hole-transport property shown as materials that can be used for the hole-transport layer 302, such as aromatic amine compounds such as NPB and BPAFLP, carbazole derivatives such as CBP, CzPA, and PCzPA, aromatic hydrocarbon compounds such as t-BuDNA, DNA, and DPAnth, and high molecular compounds such as PVK and PVTPA.

Examples of the acceptor material include organic compounds, such as 7,7,8,8-tetracyano-2,3,5,6-tetrafluoroquinodimethane (abbreviation: F$_4$-TCNQ) and chloranil, oxides of transition metals, and oxides of metals that belong to Groups 4 to 8 in the periodic table. Specifically, vanadium oxide, niobium oxide, tantalum oxide, chromium oxide, molybdenum oxide, tungsten oxide, manganese oxide, and rhenium oxide are preferable since their electron-accepting property is high. In particular, use of molybdenum oxide is preferable because of its stability in the atmosphere, a low hygroscopic property, and easily handling.

(Electron-Injection Buffer Layer 306)

The electron-injection buffer layer 306 contains a material with a high electron-injection property. The electron-injection buffer layer 306 facilitates electron injection from the charge-generation region 308 into the EL layer 203. As the material having a high electron-injection property, any of the above-described materials can be used. Alternatively, the electron-injection buffer layer 306 may contain any of the above-described materials with a high electron-transport property and donor materials.

(Electron-Relay Layer 307)

The electron-relay layer 307 immediately accepts electrons drawn out of the acceptor material in the charge-generation region 308.

The electron-relay layer 307 contains a material with a high electron-transport property. As the material with a high electron-transport property, a phthalocyanine-based material or a metal complex having a metal-oxygen bond and an aromatic ligand is preferably used.

As the phthalocyanine-based material, specifically, it is possible to use CuPc, a phthalocyanine tin(II) complex (SnPc), a phthalocyanine zinc complex (ZnPc), cobalt(II) phthalocyanine, β-form (CoPc), phthalocyanine iron (FePc), or vanadyl 2,9,16,23-tetraphenoxy-29H,31H-phthalocyanine (PhO-VOPc).

As the metal complex having a metal-oxygen bond and an aromatic ligand, a metal complex having a metal-oxygen double bond is preferably used. A metal-oxygen double bond has an acceptor property; thus, electrons can transfer (be donated and accepted) more easily.

As the metal complex having a metal-oxygen bond and an aromatic ligand, a phthalocyanine-based material is also preferably used. In particular, vanadyl phthalocyanine (VOPc), a phthalocyanine tin(IV) oxide complex (SnOPc), or a phthalocyanine titanium oxide complex (TiOPc) is preferable because a metal-oxygen double bond is more likely to act on another molecule in terms of a molecular structure and an acceptor property is high.

As the phthalocyanine-based material, a phthalocyanine-based material having a phenoxy group is preferably used. Specifically, a phthalocyanine derivative having a phenoxy group, such as PhO-VOPc, is preferably used. The phthalocyanine derivative having a phenoxy group is soluble in a solvent; thus, the phthalocyanine derivative has an advantage of being easily handled during formation of a light-emitting element and an advantage of facilitating maintenance of an apparatus used for film formation.

Examples of other materials with a high electron-transport property include perylene derivatives such as 3,4,9,10-perylenetetracarboxylic dianhydride (abbreviation: PTCDA), 3,4,9,10-perylenetetracarboxylic bisbenzimidazole (abbreviation: PTCBI), N,N'-dioctyl-3,4,9,10-perylenetetracarboxylic diimide (abbreviation: PTCDI-C8H), N,N-dihexyl-3,4,9,10-perylenetetracarboxylic diimide (abbreviation: Hex PTC), and the like. Alternatively, it is possible to use a nitrogen-containing condensed aromatic compound such as pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT (CN)$_6$), 2,3-diphenylpyrido[2,3-b]pyrazine (abbreviation: 2PYPR), or 2,3-bis(4-fluorophenyl)pyrido[2,3-b]pyrazine (abbreviation: F2PYPR). The nitrogen-containing condensed aromatic compound is preferably used for the electron-relay layer 307 because of its stability.

Further alternatively, it is possible to use 7,7,8,8-tetracyanoquinodimethane (abbreviation: TCNQ), 1,4,5,8-naphthalenetetracarboxylicdianhydride (abbreviation: NTCDA), perfluoropentacene, copper hexadecafluoro phthalocyanine (abbreviation: F$_{16}$CuPc), N,N'-bis(2,2,3,3,4,4,5,5,6,6,7,7,8,8,8-pentadecafluorooctyl)-1,4,5,8-naphthalenetetracarboxylic diimide (abbreviation: NTCDI-C8F), 3',4'-dibutyl-5,5"-bis(dicyanomethylene)-5,5"-dihydro-2,2':5',2"-terthiophene (abbreviation: DCMT), or a methanofullerene (e.g., [6,6]-phenyl C$_{61}$ butyric acid methyl ester).

The electron-relay layer 307 may further contain any of the above-described donor materials. When the donor material is contained in the electron-relay layer 307, electrons can transfer easily and the light-emitting element can be driven at a lower voltage.

The LUMO levels of the material with a high electron-transport property and the donor material are preferably −5.0 eV to −3.0 eV, i.e., between the LUMO level of the acceptor material contained in the charge-generation region 308 and the LUMO level of the material with a high electron-transport property contained in the electron-transport layer 304 (or the LUMO level of the EL layer 203 in contact with the electron-relay layer 307 or with the electron-injection buffer layer 306). When a donor material is contained in the electron-relay layer 307, as the material with a high electron-transport property, a material with a LUMO level higher than the acceptor level of the acceptor material contained in the charge-generation region 308 can be used.

The above-described layers included in the EL layer 203 and the intermediate layer 207 can be formed separately by any of the following methods: an evaporation method (including a vacuum evaporation method), a transfer method, a printing method, an inkjet method, a coating method, and the like.

By use of a light-emitting element described in this embodiment, a passive matrix light-emitting device or an active matrix light-emitting device in which driving of the light-emitting element is controlled by a transistor can be manufactured. Furthermore, the light-emitting device can be applied to an electronic device, a lighting device, or the like.

Note that this embodiment can be combined with the other embodiment as appropriate.

This application is based on Japanese Patent Application serial no. 2012-025834 filed with Japan Patent Office on Feb. 9, 2012, the entire contents of which are hereby incorporated by reference.

What is claimed is:

1. A light-emitting device comprising a hole-injection layer, a hole-transport layer, and a light-emitting layer between a pair of electrodes, the light-emitting layer comprising:
   a phosphorescent compound; and
   a substance exhibiting thermally activated delayed fluorescence,
   wherein the substance exhibiting thermally activated delayed fluorescence is a heterocyclic compound comprising a π-electron deficient heteroaromatic ring,
   wherein a difference between an energy value of a peak of a fluorescence spectrum of the substance exhibiting thermally activated delayed fluorescence and an energy value of a peak of the lowest-energy-side absorption band in an absorption spectrum of the phosphorescent compound is 0.2 eV or less, and
   wherein a $T_1$ level of the substance exhibiting thermally activated delayed fluorescence is higher than a $T_1$ level of the phosphorescent compound.

2. The light-emitting device according to claim 1, wherein the phosphorescent compound is an organometallic complex.

3. The light-emitting device according to claim 1, wherein the lowest-energy-side absorption band comprises an absorption band based on a triplet MLCT transition.

4. The light-emitting device according to claim 1, wherein the heterocyclic compound further comprises a π-electron excess heteroaromatic ring.

5. The light-emitting device according to claim 1, wherein the phosphorescent compound is an iridium complex.

6. A light-emitting device comprising a hole-injection layer, a hole-transport layer, and a light-emitting layer between a pair of electrodes, the light-emitting layer comprising:
   a phosphorescent compound; and
   a substance exhibiting thermally activated delayed fluorescence,
   wherein a difference between an energy value of a peak of a fluorescence spectrum of the substance exhibiting thermally activated delayed fluorescence and an energy value of a peak of the lowest-energy-side absorption band in an absorption spectrum of the phosphorescent compound is 0.1 eV or less, and
   wherein a $T_1$ level of the substance exhibiting thermally activated delayed fluorescence is higher than a $T_1$ level of the phosphorescent compound.

7. The light-emitting device according to claim 6, wherein the phosphorescent compound is an organometallic complex.

8. The light-emitting device according to claim 6, wherein the lowest-energy-side absorption band comprises an absorption band based on a triplet MLCT transition.

9. The light-emitting device according to claim 6, wherein the substance exhibiting thermally activated delayed fluorescence is a heterocyclic compound comprising a π-electron excess heteroaromatic ring and a π-electron deficient heteroaromatic ring.

10. The light-emitting device according to claim 6, wherein the phosphorescent compound is an iridium complex.

11. A light-emitting device comprising a hole-injection layer, a hole-transport layer, and a light-emitting layer between a pair of electrodes, the light-emitting layer comprising:
    an iridium complex; and
    a substance exhibiting thermally activated delayed fluorescence,
    wherein a difference between an energy value of a peak of a fluorescence spectrum of the substance exhibiting thermally activated delayed fluorescence and an energy value of a peak of the lowest-energy-side absorption band in an absorption spectrum of the iridium complex is 0.2 eV or less, and
    wherein a $T_1$ level of the substance exhibiting thermally activated delayed fluorescence is higher than a $T_1$ level of the iridium complex.

12. The light-emitting device according to claim 11, wherein the lowest-energy-side absorption band comprises an absorption band based on a triplet MLCT transition.

13. The light-emitting device according to claim 11, wherein the substance exhibiting thermally activated delayed fluorescence is a heterocyclic compound comprising a π-electron excess heteroaromatic ring and a π-electron deficient heteroaromatic ring.

* * * * *